US008659003B2

(12) United States Patent
Herner et al.

(10) Patent No.: US 8,659,003 B2
(45) Date of Patent: Feb. 25, 2014

(54) DISTURB-RESISTANT NON-VOLATILE MEMORY DEVICE AND METHOD

(71) Applicant: Crossbar, Inc., Santa Clara, CA (US)

(72) Inventors: Scott Brad Herner, San Jose, CA (US); Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/733,828

(22) Filed: Jan. 3, 2013

(65) Prior Publication Data

US 2013/0214241 A1 Aug. 22, 2013

Related U.S. Application Data

(62) Division of application No. 12/861,666, filed on Aug. 23, 2010, now Pat. No. 8,404,553.

(51) Int. Cl.
*H01L 29/06* (2006.01)

(52) U.S. Cl.
USPC .............................. 257/5; 365/148; 438/382

(58) Field of Classification Search
USPC ........... 365/148; 257/4, 5, E45.001, E21.004; 438/382
See application file for complete search history.

(56) References Cited

U.S. PATENT DOCUMENTS

| 6,762,474 | B1 | 7/2004 | Mills, Jr. |
| 7,324,363 | B2 | 1/2008 | Kerns et al. |
| 7,749,805 | B2 | 7/2010 | Pinnow et al. |
| 8,207,064 | B2 * | 6/2012 | Bandyopadhyay et al. .. 438/683 |
| 8,374,018 | B2 | 2/2013 | Lu |
| 8,385,100 | B2 | 2/2013 | Kau et al. |
| 2005/0062045 | A1 | 3/2005 | Bhattacharyya |
| 2006/0281244 | A1 | 12/2006 | Ichige et al. |
| 2007/0008773 | A1 * | 1/2007 | Scheuerlein .................. 365/161 |
| 2007/0090425 | A1 | 4/2007 | Kumar et al. |
| 2007/0228414 | A1 | 10/2007 | Kumar et al. |
| 2007/0284575 | A1 | 12/2007 | Li et al. |
| 2008/0185567 | A1 | 8/2008 | Kumar et al. |
| 2008/0278990 | A1 | 11/2008 | Kumar et al. |
| 2008/0304312 | A1 | 12/2008 | Ho et al. |

(Continued)

OTHER PUBLICATIONS

Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.

(Continued)

*Primary Examiner* — Mark Tornow
(74) *Attorney, Agent, or Firm* — Ogawa P.C.

(57) ABSTRACT

A method of forming a disturb-resistant non volatile memory device. The method includes providing a semiconductor substrate having a surface region and forming a first dielectric material overlying the surface region. A first wiring material overlies the first dielectric material, a doped polysilicon material overlies the first wiring material, and an amorphous silicon switching material overlies the said polysilicon material. The switching material is subjected to a first patterning and etching process to separating a first strip of switching material from a second strip of switching spatially oriented in a first direction. The first strip of switching material, the second strip of switching material, the contact material, and the first wiring material are subjected to a second patterning and etching process to form at least a first switching element from the first strip of switching material and at least a second switching element from the second strip of switching material, and a first wiring structure comprising at least the first wiring material and the contact material. The first wiring structure being is in a second direction at an angle to the first direction.

3 Claims, 10 Drawing Sheets

(56) References Cited

U.S. PATENT DOCUMENTS

| | | |
|---|---|---|
| 2008/0311722 A1 | 12/2008 | Petti et al. |
| 2009/0095951 A1 | 4/2009 | Kostylev et al. |
| 2009/0152737 A1 | 6/2009 | Harshfield |
| 2009/0298224 A1* | 12/2009 | Lowrey ............... 438/102 |
| 2010/0019221 A1 | 1/2010 | Lung et al. |
| 2010/0163828 A1 | 7/2010 | Tu |
| 2010/0221868 A1 | 9/2010 | Sandoval |
| 2011/0136327 A1 | 6/2011 | Han et al. |
| 2011/0155991 A1* | 6/2011 | Chen ..................... 257/4 |
| 2011/0198557 A1* | 8/2011 | Rajendran et al. ......... 257/4 |
| 2011/0204312 A1 | 8/2011 | Phatak |
| 2011/0205782 A1 | 8/2011 | Costa et al. |
| 2011/0305064 A1 | 12/2011 | Jo et al. |
| 2012/0007035 A1 | 1/2012 | Jo et al. |
| 2012/0080798 A1 | 4/2012 | Harshfield |
| 2012/0104351 A1* | 5/2012 | Wei et al. ................ 257/4 |
| 2012/0108030 A1 | 5/2012 | Herner |
| 2012/0205606 A1 | 8/2012 | Lee et al. |

OTHER PUBLICATIONS

Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.

Office Action for U.S. Appl. No. 13/077,941, dated Aug. 12, 2013.

Notice of Allowance for U.S. Appl. No. 13/679,976, dated Sep. 17, 2013.

Office Action for U.S. Appl. No. 13/189,401 dated Sep. 30, 2013.

Office Action for U.S. Appl. No. 13/462,653 dated Sep. 30, 2013.

Office Action for U.S. Appl. No. 13/594,665 dated Aug. 2, 2013.

Notice of Allowance for U.S. Appl. No. 13/769,152, dated Oct. 8, 2013.

Notice of Allowance for U.S. Appl. No. 13/905,074, dated Oct. 8, 2013.

Notice of Allowability for U.S. Appl. No. 13/452,657, dated Oct. 10, 2013.

* cited by examiner

DISTURB-RESISTANT NON-VOLATILE MEMORY DEVICE AND METHOD

CROSS REFERENCE TO RELATED APPLICATIONS

The present invention claims priority to and is a divisional of U.S. application Ser. No. 12/861,666, filed Aug. 23, 2010. That application is herein by incorporated by reference for all purposes.

BACKGROUND

The present invention is generally related to resistive switching devices. More particularly, embodiments according to the present invention provide a method and a structure for forming a vertical resistive switching device. The present invention can be applied to non-volatile memory devices but it should be recognized that the present invention can have a much broader range of applicability The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Power dissipation during switching for a PCRAM device is usually large. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is directed to switching devices. More particularly, embodiments according to the present invention provide a method and a structure to form an array of switching devices. The present invention has be applied to forming a disturb-resistant non-volatile memory device using an amorphous silicon switching material. But it should be recognized that embodiments of the present invention can be applied to other devices.

In a specific embodiment, a method of forming a disturb-resistant non-volatile memory device is provided. The method includes providing a substrate having a surface region and forming a first dielectric material overlying the surface region of the substrate. A first wiring material is formed overlying the first dielectric material and a contact material comprising a p+ doped polysilicon material is formed overlying the first wiring material. The method forms a switching material comprising an amorphous silicon material overlying the contact material. In a specific embodiment, the method includes subjecting the switching material to a first pattering and etching process to separating a first strip of switching material from a second strip of switching material. The first strip of switching material and the second strip of switching material are spatially oriented in a first direction in a specific embodiment. The method then subjects the first strip of switching material, the second strip of switching material, the contact material, and the first wiring material to a second patterning and etching process. The second patterning and etching process cause formation of at least a first switching element from the first strip of switching material and at least a second switching element from the second strip of switching material, and a first wiring structure comprising at least the first wiring material and the contact material. In a specific embodiment, the first wiring structure is configured to extend in a second direction at an angle to the first direction.

In a specific embodiment, a method of foil ling a disturb-resistant non volatile memory device is provided. The method includes providing a first cell and a second cell. The first cell includes a first wiring structure, a second wiring structure, a contact material overlying the first wiring structure and a switching material overlying the contact material. In a specific embodiment, the first wiring structure is configured to extend in a first direction and a second wiring structure extending in a second direction orthogonal to the first direction. In a specific embodiment, the switching material includes an amorphous silicon material and the contact material comprising a p+ polysilicon material. In a specific embodiment, the first cell includes a first switching region formed in an intersecting region between the first wiring structure and the second wiring structure and a contact region between the switching first wiring structure and the switching region. In a specific embodiment, the second cell is formed from the first wiring structure, the switching material, the contact material, and a third wiring structure. The third wiring structure is configured parallel to the second wiring structure in a specific embodiment. A second switching region is formed in an intersecting region between the first wiring structure and the third wiring structure. In a specific embodiment, at least the switching material forms a coupling between the first cell and the second cell. In a specific embodiment, the coupling is eliminated at least by removing a portion of the switching material to form a void region. The void region is filled using a dielectric material to electrically and physically isolate at least the first switching region and the second switching region. In other implementation, a first void region can further be formed between the first contact region and the second region. The dielectric material fills the void region and the first void region to electrically and physically isolate the first switching region form the second switching region, and to electrically and physically the first contact region from the second contact region in a specific embodiment.

In a specific embodiment, a non-volatile memory device is provided. The device includes a substrate having a surface region and a first dielectric material overlying the surface region of the semiconductor substrate. The device includes at least a first cell and a second cell. In a specific embodiment, the first cell includes a first wiring structure extending in a first direction overlying the first dielectric material. A first contact region overlies the first wiring structure and a first switching region overlies the first contact region. The first contact region includes a p+ polysilicon material and the first switching region includes an amorphous silicon material in a specific embodiment. The first cell includes a second wiring structure extending in a second direction orthogonal to the first direction overlying the switching region. The second cell includes a second contact region comprising the p+ polysilicon material overlying the first wiring structure. A second switching region comprising the amorphous silicon material overlies the second contact region. The second cell includes a third wiring structure overlying the second switching region. The third wiring structure is separated from the second wiring structure and parallel to the second wiring structure. In a specific embodiment, a dielectric material is disposed at least in a region between the first switching region and the second switching region to electrically and physically isolate the first switching region and the second switching region. In other embodiment, the dielectric material is further disposed between a first region between the first contact region and the second contact region to further electrically and physically isolate the first contact region and the second region.

Many benefits can be achieved by ways of present invention. The present invention uses convention CMOS fabrication techniques to form a disturb resistant non-volatile memory array. Embodiments according to the present invention further provide an array of interconnected switching devices to be used in a high density memory device. Depending on the embodiment, one or more of these benefits can be achieved. One skilled in the art would recognize other variations, modifications, and alternatives.

DETAILED DESCRIPTION OF THE PRESENT INVENTION

The present invention is generally related to switching devices. More particularly, embodiments according to the present invention provide a method and a structure to form an array of switching devices. The present invention has be applied to forming a disturb resistant non-volatile memory device using an amorphous silicon switching material. But it should be recognized that embodiments of the present invention can be applied to other devices.

Figure 1:
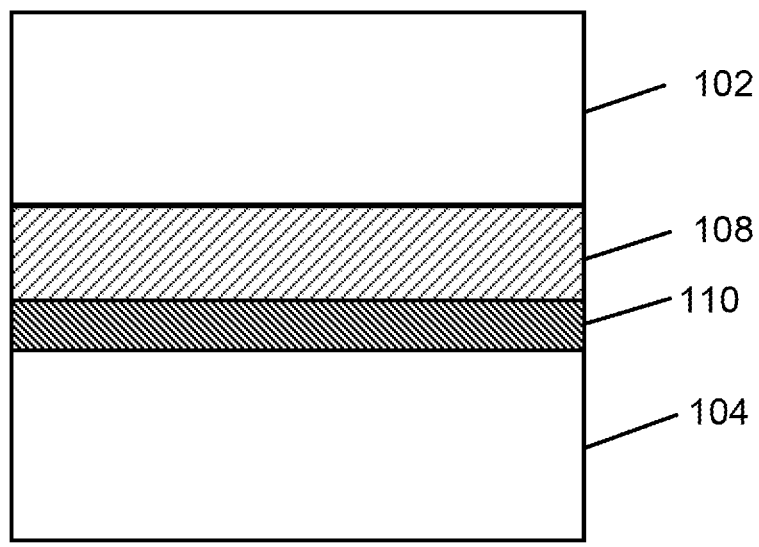
FIG. 1 is a simplified diagram illustrating a resistive switching device according to an embodiment of the present invention.

FIG. 1 is a simplified diagram illustrating a cross section of a resistive switching device 100. The resistive switching device includes a top wiring structure 102, a bottom wiring structure 104 and a switching element 108 disposed between the top wiring structure and the bottom wiring structure. The top electrode and the bottom electrode are arranged orthogonal to each other in a crossbar to form a highly interconnected structure. In this implementation, the top wiring structure and the bottom wiring structure can have a portion including a conductor material such as tungsten, copper, or aluminum that are commonly used in CMOS processing. The top wiring structure further includes a metal material in contact with the switching element. For a switching element using an amorphous silicon material, the metal material can be silver or other suitable metal materials. Other suitable metal materials can include gold, platinum, palladium, and others, depending on the application. The silver material can be formed in a via structure connecting the amorphous silicon switching material to other portion of the top wiring structure. Again, for an amorphous silicon switching material, the bottom electrode can include a buffer layer 110 between the wiring material and the switching material to provide desirable switching characteristics upon application of a voltage or a current to the top electrode or the bottom electrode. The buffer layer can be a doped silicon material such as a p+ doped polysilicon in a specific embodiment.

Figure 2:
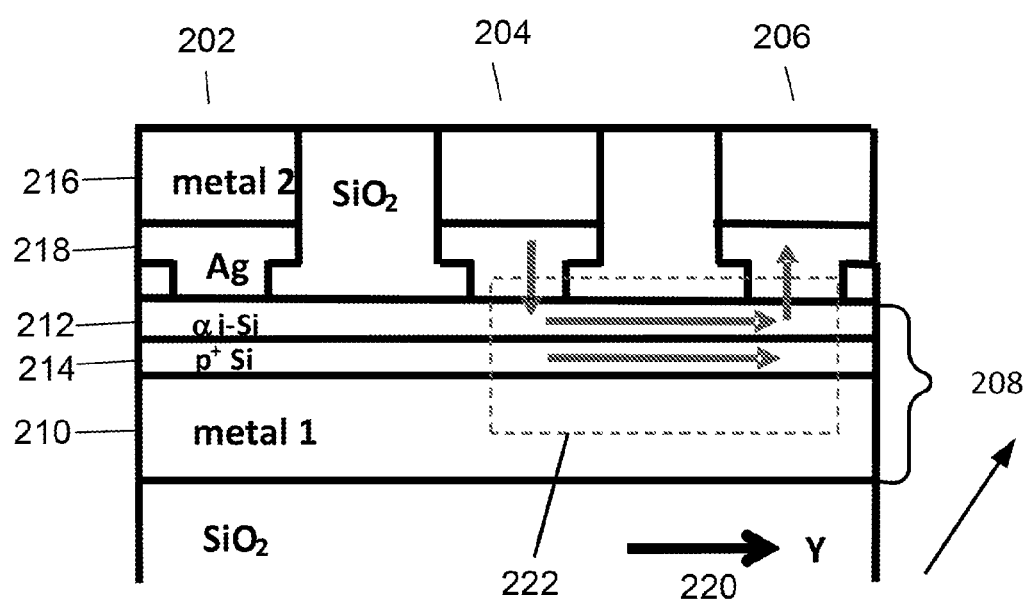
FIG. 2 is a simplified diagram illustrating a conventional method of fabricating an array of switching devices.

FIG. 2 illustrates three interconnected switching devices 202, 204, and 206, formed using a conventional method. As shown, each of the switching devices has a bottom stack 208 including a bottom electrode 210, amorphous silicon layer 212 and p+ polysilicon layer 214 disposed in a first direction 220. The top electrode 216 including silver material 218 is formed orthogonal to the bottom stack. In a specific embodiment, silver material 218 is disposed in a via structure in direct contact with the amorphous silicon material. For this structure, a parasitic leakage path 222 can form between adjacent cells in the first direction during read, write, or erase cycles and cause cross-talk between adjacent cells as shown.

Embodiments of the present invention provide a method and a structure to form non-volatile memory device having a silver/amorphous silicon material/bottom electrode configuration. The present method and structure provide a device that is resistant to cross talk or disturb between adjacent cells in.

Figure 3:
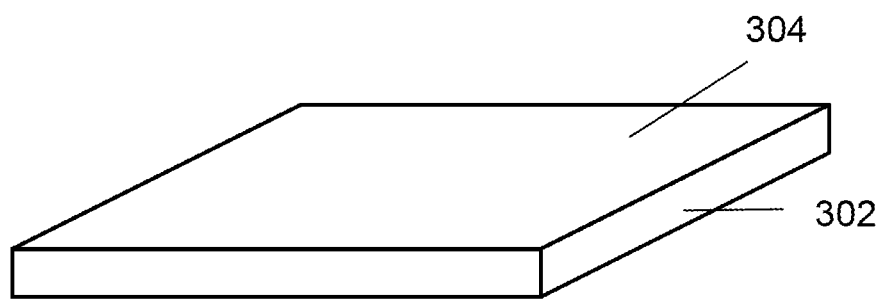
FIGS. 3-13 are simplified diagrams illustrating a method of forming a disturb resistant memory device according to an embodiment of the present invention.

FIGS. 3-12 are simplified diagrams illustrating a method of forming a non-volatile memory device according to embodiments of the present invention. As shown in FIG. 3, the method includes a semiconductor substrate 302 having a surface region 304. The semiconductor substrate can be a silicon material, a silicon germanium substrate, silicon on insulator substrate, or others, depending on the application. In a specific embodiment, the substrate can also include one or more transistor devices formed thereon. The one or more transistor devices are operably coupled to the memory devices and control the memory devices in certain embodiment.

Figure 4:
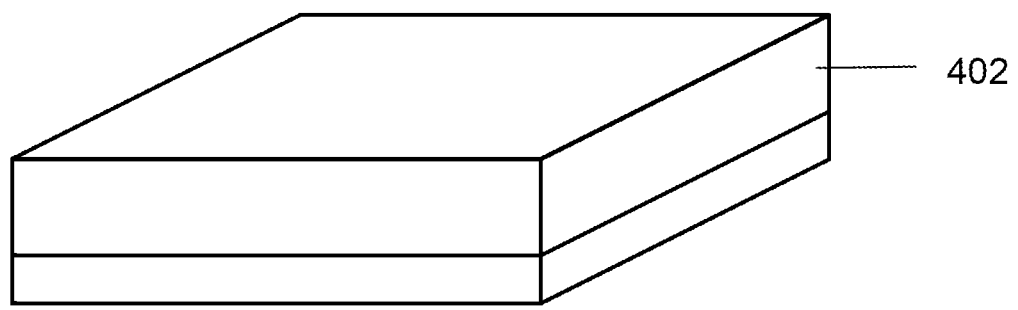

The method includes forming a first dielectric material 402 overlying the surface region of the substrate as shown in FIG. 4. The first dielectric material can be silicon dioxide, silicon nitride, low K dielectric, or a dielectric stack such as silicon oxide on silicon nitride on silicon oxide, commonly known as ONO, depending on the application. The first dielectric material can be formed using techniques such as chemical vapor deposition; including plasma enhanced chemical vapor deposition, physical vapor deposition or a combination depending on the application.

Figure 5:
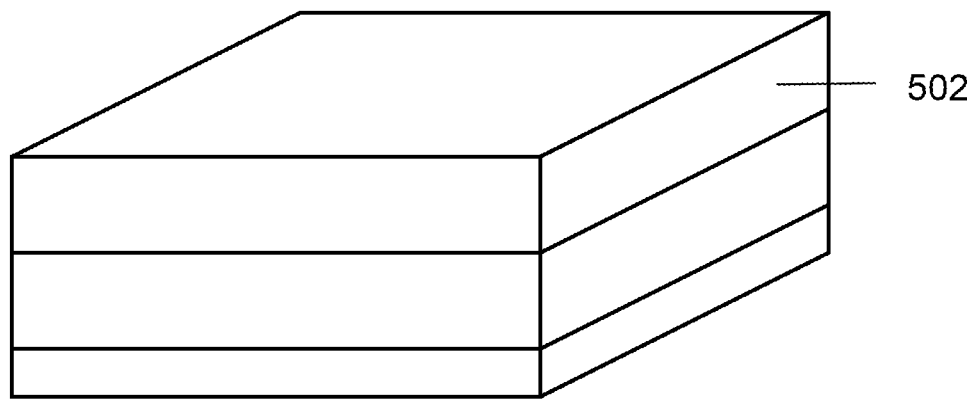

Referring to FIG. 5, the method includes forming a first wiring material 502 overlying the first dielectric material. The first wiring material can include common metal materials used in CMOS processing, such as tungsten, copper, or aluminum. The first wiring material can further include one or more adhesion layer or diffusion barrier layer between the metal material and the first dielectric layer in a specific embodiment. The adhesion layer or diffusion barrier layer can be titanium, titanium nitride, tungsten nitride, or others depending on the embodiment.

Figure 6:
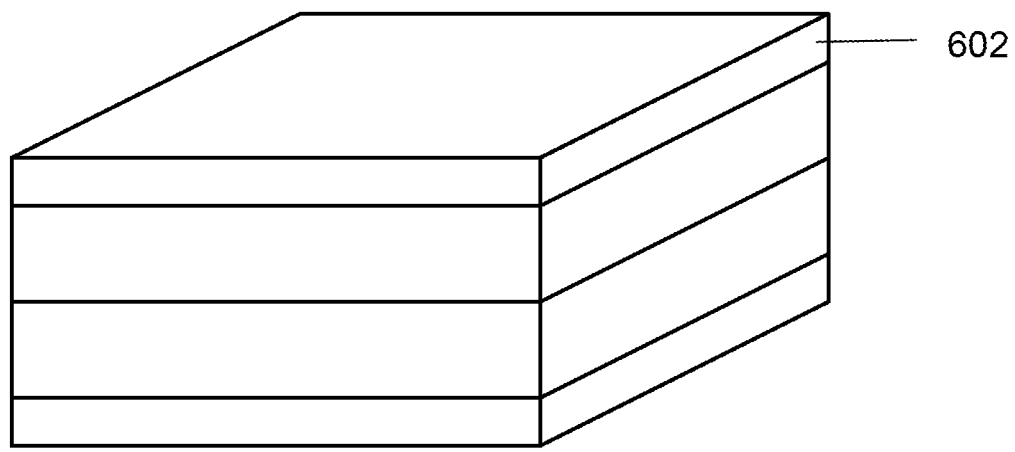

As shown in FIG. 6, the method includes depositing a contact material 602 comprising a silicon material overlying the first wiring material. The silicon material can be a p+ polysilicon material in a specific embodiment. The p+ polysilicon material can be deposited using techniques such as chemical vapor deposition and precursor such as silane, disilane, or a suitable chlorosilane, and boron as a dopant in a specific embodiment. Deposition temperature can range from about 400 Degree Celsius to about 750 Degree Celsius depending on the process and precursors used. Depending on the application, the contact material can be optional.

Figure 7:
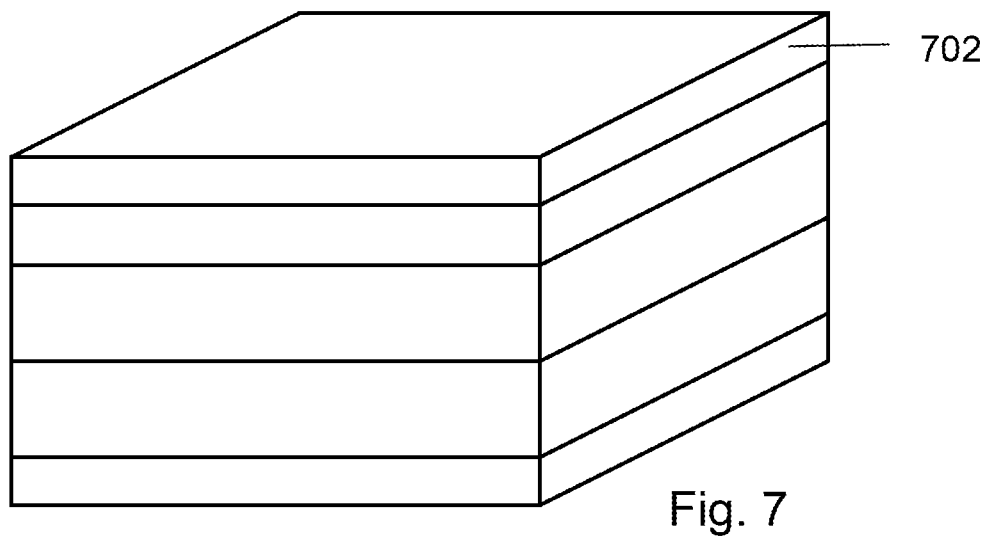

The method includes forming a switching material 702 overlying the contact material as shown in FIG. 7. In a specific embodiment, the switching material comprises an amorphous silicon material. The amorphous silicon material can be deposited using techniques such as chemical vapor deposition and precursor such as silane, disilane, or a suitable chlorosilane in a specific embodiment. Deposition temperature is usually maintained between 250 Degree Celsius to about 500 Degree Celsius depending on the embodiment. In a specific embodiment, the p+ polysilicon material prevents an interfacial region to form between the amorphous silicon material and the first conductor material. The interface region can have an excessive defect sites, affecting proper switching.

Figure 8:
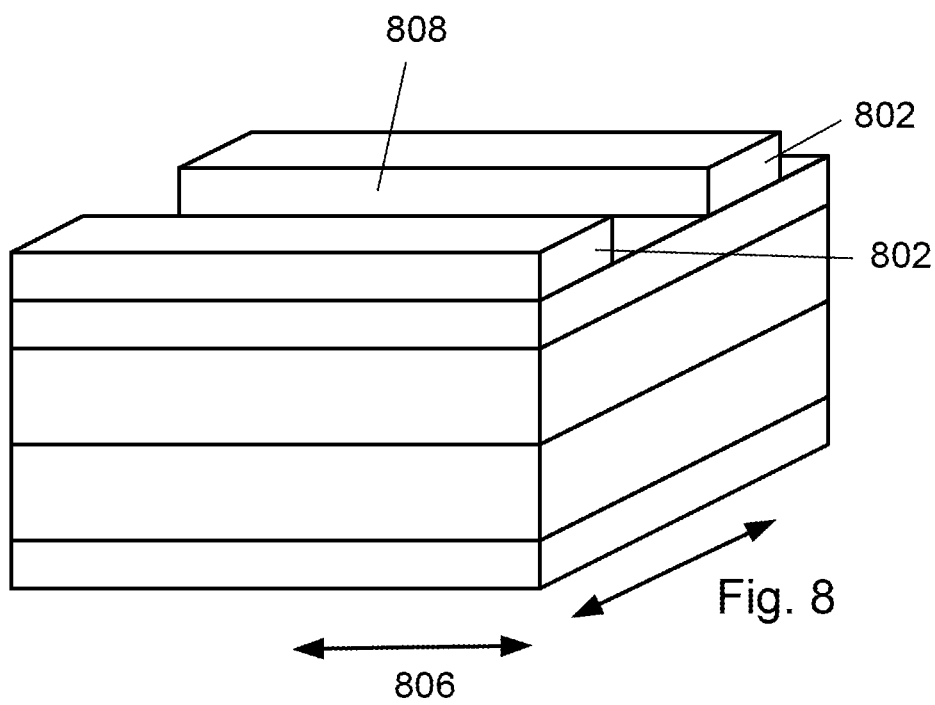

In a specific embodiment, the method includes subjects the amorphous silicon material to a first pattern and etch process to form a plurality of strips of amorphous silicon material 802 as shown in FIG. 8. As shown, each of the strips of amorphous silicon material is extended in a first direction 806 and separated by a first opening region 808. Each of the plurality of strips of amorphous silicon material is spatially parallel to each other in a specific embodiment.

Figure 9:
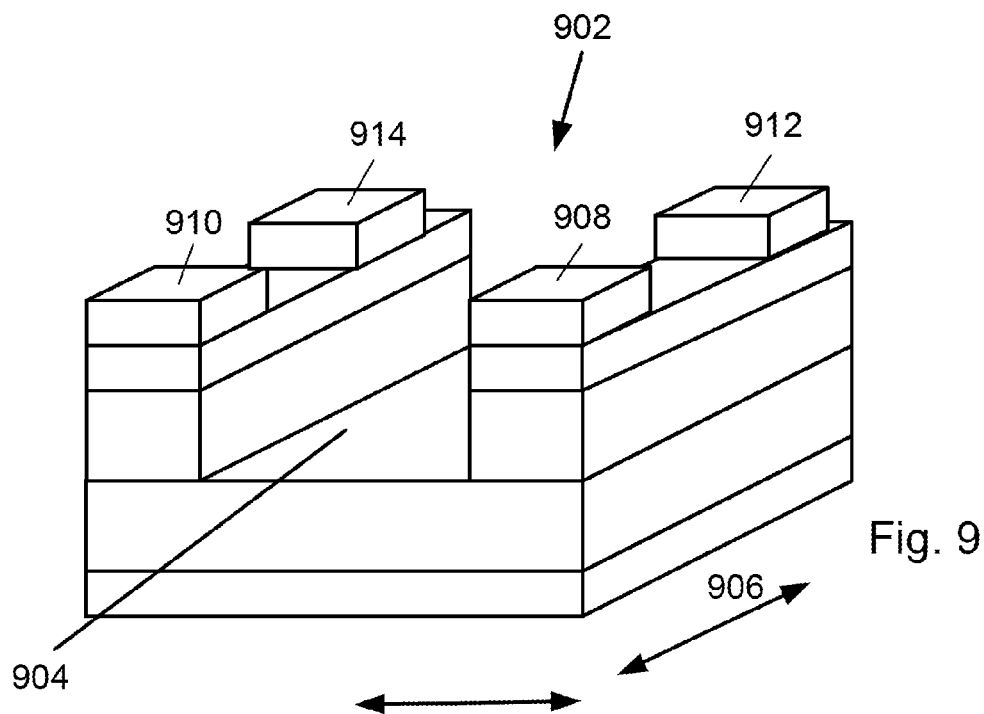

In a specific embodiment, a second pattern and etch process is performed to remove a stack of materials comprise of amorphous silicon material, a portion of the polysilicon material and a portion of the first wiring material to form a second opening region 902 as shown in FIG. 9. As shown, the second opening region includes a trench structure 904 and a portion of the first opening region. The trench structure is configured in a second direction 906 at an angle to the first direction. The second direction is orthogonal to the first direction in a specific embodiment though other angles may also be used. As shown, the first pattern and etching process and the second pattern and etching process cause formation of a first switching element 908 associated with a first switching device, a second switching element 910 associated with a second switching device, a third switching element 912 associated with a third switching device, and a fourth switching element 914 associated with a fourth switching device.

Figure 10:
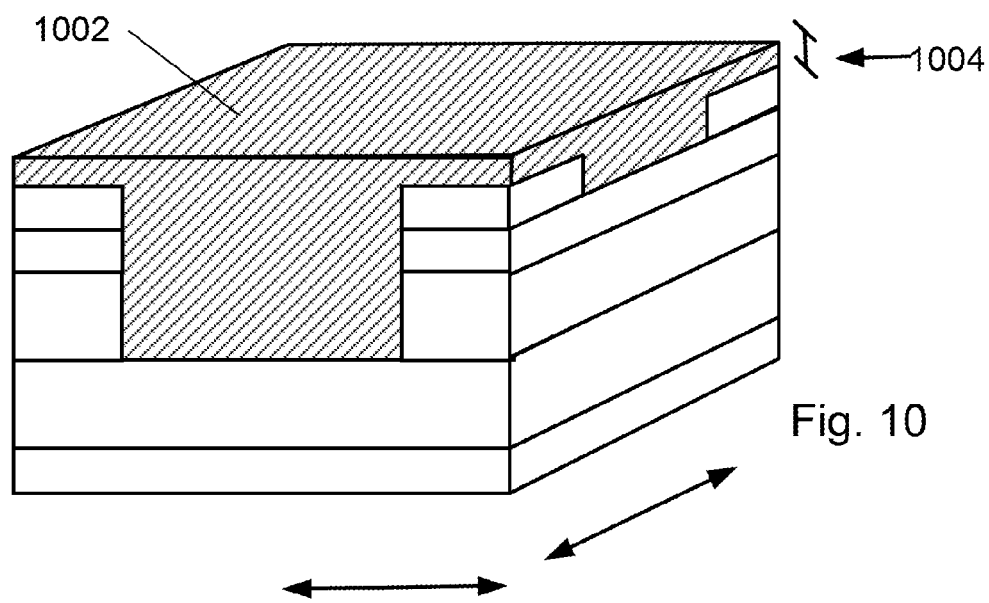

Referring to FIG. 10, the method includes forming a third dielectric material 1002 to fill the second opening region. As shown the first switching element and the second element are isolated by at least the third dielectric material in the first opening region in the first direction in a specific embodiment. In a specific embodiment, the third dielectric material further forms a thickness 1004 overlying each of the switching elements in a specific embodiment. The third dielectric material can be silicon oxide in a specific embodiment. Other suitable dielectric materials such as silicon nitride can also be used. As shown, the third dielectric material isolates neighboring amorphous switching element and prevent parasitic leakage path to form from the amorphous silicon material in a specific embodiment. One skilled in the art would recognize other modifications, variations, and alternatives.

Figure 11:
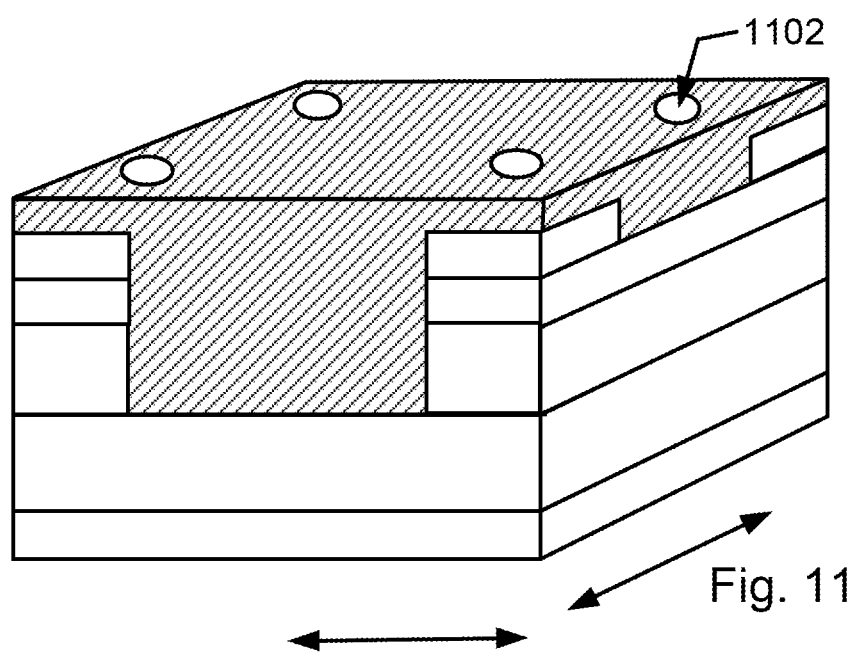

Referring to FIG. 11, the method subjects the third dielectric material to a third pattern and etch process to form a plurality of openings 1102 in a portion of the thickness of the third dielectric layer overlying each of the switching element in a specific embodiment. Optionally, the third dielectric material is subjected to a planarizing process prior to the third patterning and etching process. The third patterning and etching process exposes a top surface region of the switching material in a specific embodiment.

Figure 12:
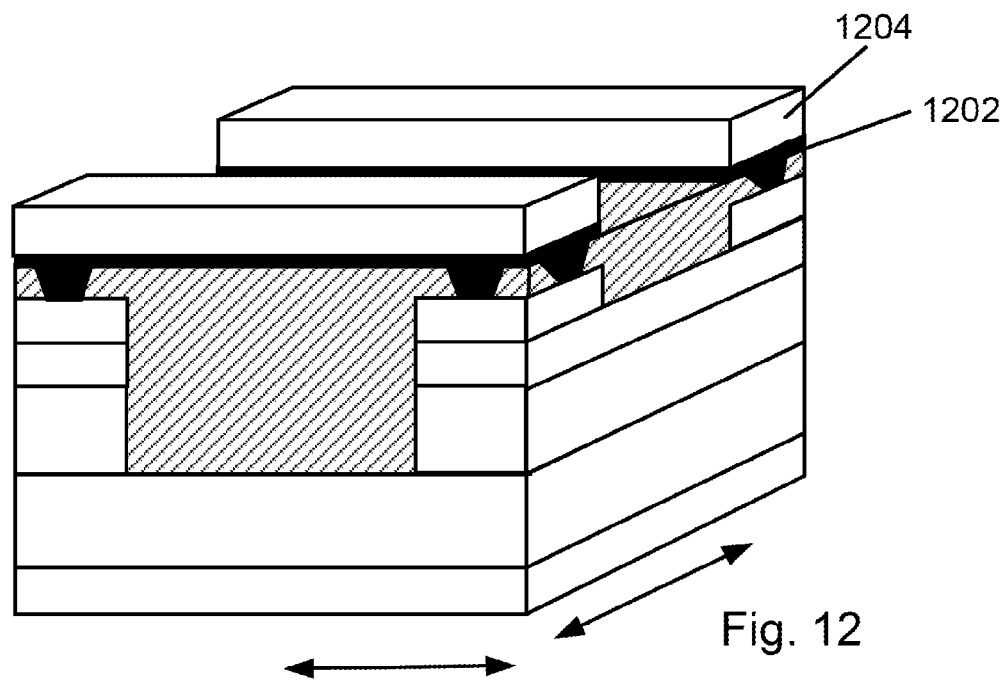

Referring to FIG. 12, the method includes forming a metal material 1202 overlying at least each of the plurality of openings. In a specific embodiment, the metal material at least partially fills each of the plurality of openings to form a contact with the switching material in a specific embodiment. The metal material is selected to have a suitable diffusion characteristic in the amorphous silicon material in a specific embodiment. Depending on the application, the metal material can be silver, gold, platinum, palladium, aluminum, among others. In a specific embodiment, the metal material is a silver material. A second wiring material 1204 is deposited overlying the metal material. The second wiring material can be a conductor material commonly used in CMOS fabrication. Examples of the conductor material are copper, aluminum, tungsten, including a combination, depending on the embodiment. In a specific embodiment, the second wiring material and the metal material are subjected to a fourth pattern and etch process to form a second wiring structure 1204. Second wiring structure includes metal material 1202 in a specific embodiment.

Figure 13:
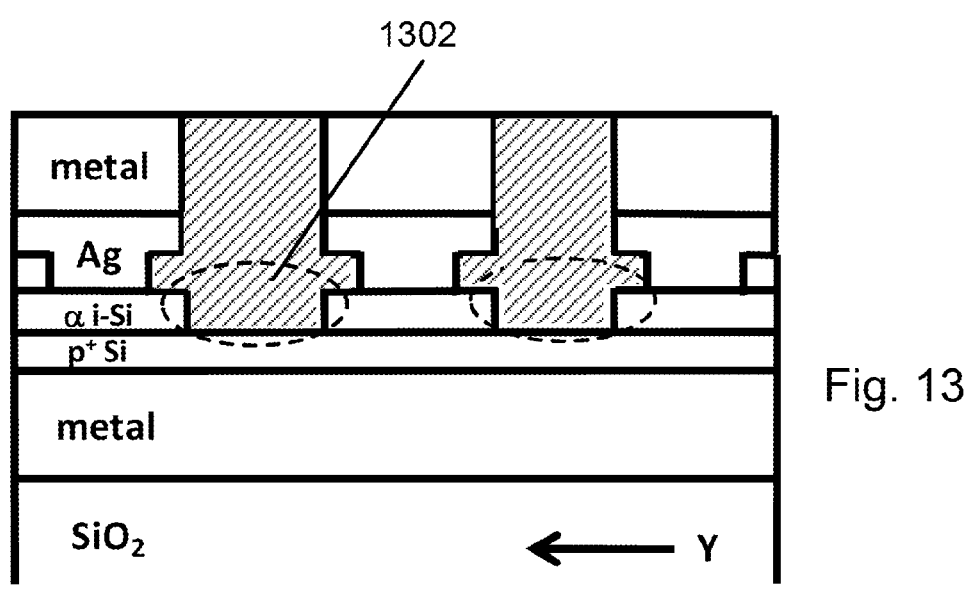

FIG. 13 is a cross sectional view of the non-volatile memory device in the second direction. As shown, the amorphous silicon switching elements is insulated from a neighboring switching element by portions 1302 of third dielectric material 1002, preventing disturb during operations in a specific embodiment.

Figure 14:
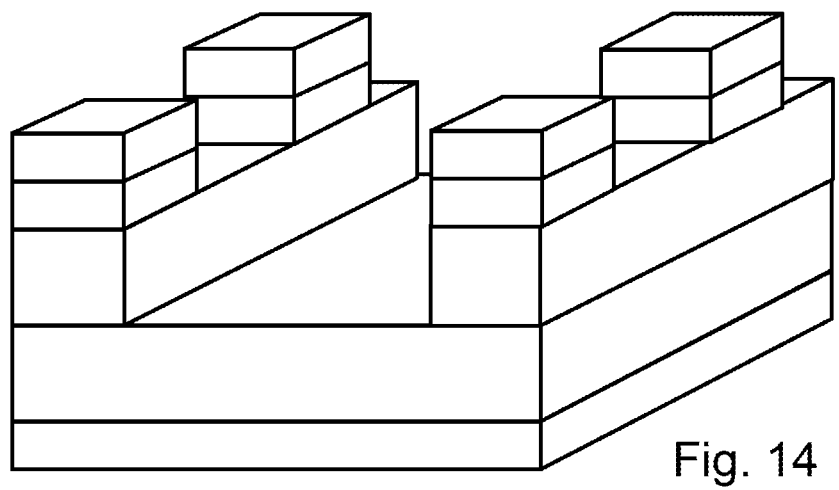
FIGS. 14-16 are simplified diagrams illustrating an alternative method of forming a disturb resistant memory device according to an embodiment of the present invention.
Figure 15:
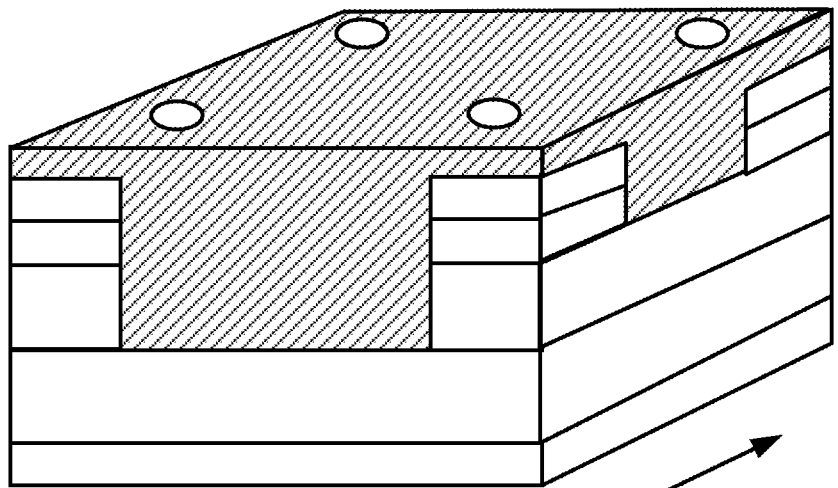
Figure 16:
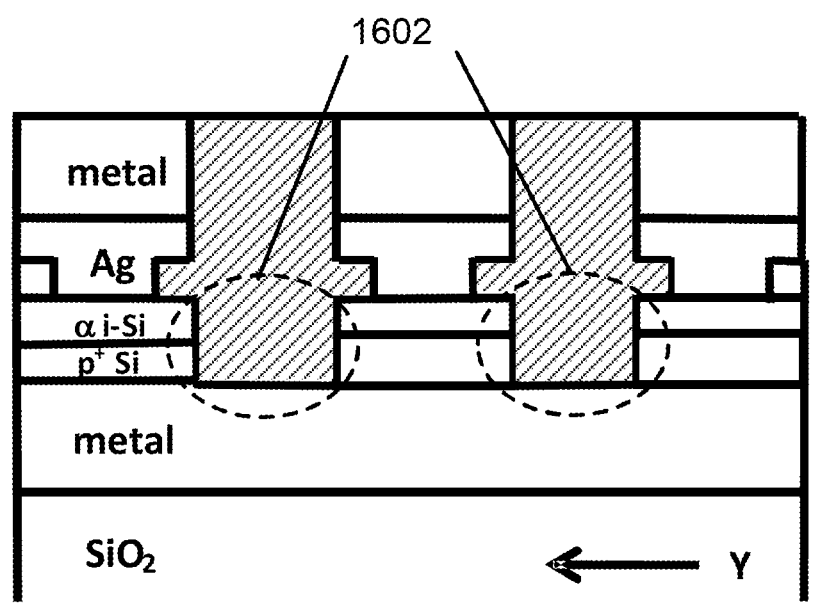

Depending on the embodiment, there can be other variations. For example, as shown in FIGS. 14-16, the first etching process can further remove the p+ polysilicon material in addition to the amorphous silicon material in a specific embodiment. This is more practical as the metal surface can be an effective etch stop for the first etching process. As shown in FIG. 16, the third dielectric material provides isolation 1602 to both the p+ polysilicon material and the amorphous silicon material between neighboring resistive switching devices in the first direction as illustrated in FIG. 16.

In a specific embodiment, a method of forming a non-volatile memory device is provided. The method includes providing a first cell and a second cell in an N by M array of interconnected crossbar structures. The first cell includes a first wiring structure extending in a first direction and a second wiring structure extending in a second direction. The first direction and the second direction are at angle to each other. In a specific embodiment, the first wiring structure is configured to be orthogonal to the second wiring structure, forming a crossbar structure. In a specific embodiment, the first cell includes a contact material overlying the first wiring structure and a switching material overlying the contact material. In a specific embodiment, the contact material can be a p+ polysilicon material and the switching material can include an amorphous silicon material. The first call includes a first amorphous silicon switching region disposed in an intersecting region between the first wiring structure and the second wiring structure in a specific embodiment. In a specific embodiment, the second cell In a specific embodiment, the second cell is formed from the first wiring structure, the switching material, the contact material, and a third wiring structure. The third wiring structure is parallel to the second wiring structure and separated from the second wiring structure in a specific embodiment. In a specific embodiment, a second switching region is dispose in an intersecting region between the first wiring structure and the third wiring structure. At least the switching material and the contact material form a coupling between the first cell and the second cell. The coupling is eliminated by removing a portion of the switching material and the contact material to form a void region between the first cell and the second cell. In a specific embodiment, the void region is filled using a dielectric material to electrically and physically isolate at least the first switching region and the second switching region. The dielectric material prevents disturb between the first cell and the second cell in a specific embodiment as illustrated in FIGS. 13 and 16.

In a specific embodiment, a non-volatile memory device is provided. The device includes a substrate having a surface region. A first dielectric material overlying the surface region of the semiconductor substrate. The device includes at least a first cell and a second cell. The first cell and the second cell are provided in an array of N by M interconnected crossbar structure in a specific embodiment. The first cell includes a first wiring structure extending in a first direction overlying the first dielectric material, a first contact region comprising a p+ polysilicon material, a first switching region comprising an amorphous silicon material, and a second wiring structure extending in a second direction orthogonal to the first direction in a specific embodiment. The second cell includes the first wiring structure, a second contact region comprising the p+ polysilicon material, a second switching region comprising the amorphous silicon material, and a third wiring structure. The third wiring structure is separated from the second wiring structure and spatially parallel to the second wiring structure in a specific embodiment. In a specific embodiment, a dielectric material is disposed at least in a region between the first switching region and the second switching region to electrically and physically isolate at least the first switching region from the second switching region. The dielectric material prevents cross talk and disturbs between the first cell and the second cell when one of the cells is selected in each of the programming, writing, reading or erase cycles as illustrated in FIGS. 13 and 16.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device structure, comprising:
   a substrate having a surface region;
   a first dielectric material overlying the surface region of the semiconductor substrate;
   a first cell, the first cell comprising a first wiring structure extending in a first direction overlying the first dielectric material, a first contact region comprising a p+ polysilicon material, a first switching region comprising an amorphous silicon material, and a second wiring structure extending in a second direction orthogonal to the first direction;
   a second cell, the second cell comprising the first wiring structure, a second contact region comprising the p+ polysilicon material, a second switching region comprising the amorphous silicon material, and a third wiring structure separated from the second wiring structure and parallel to the second wiring structure; and
   a second dielectric material disposed at least in a region between the first switching region and the second switching region to electrically and physically isolate the first switching region and the second switching region.

2. The device of claim 1 wherein the first call and the second cell are provided in an N by M interconnected crossbar array.

3. The device of claim 1 wherein the second dielectric material is further disposed in a first region between the first contact region and the second contact region, and a second region between the second wiring structure and the third wiring structure.

\* \* \* \* \*